US011011815B2

(12) United States Patent
Ali et al.

(10) Patent No.: US 11,011,815 B2
(45) Date of Patent: May 18, 2021

(54) CIRCULARLY-POLARIZED DIELECTRIC WAVEGUIDE LAUNCH FOR MILLIMETER-WAVE DATA COMMUNICATION

(71) Applicant: Texas Instruments Incorporated, Dallas, TX (US)

(72) Inventors: Hassan Omar Ali, Murphy, TX (US); Juan Alejandro Herbsommer, Allen, TX (US); Benjamin Cook, Los Gatos, CA (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 56 days.

(21) Appl. No.: 16/393,809

(22) Filed: Apr. 24, 2019

(65) Prior Publication Data
US 2019/0334220 A1 Oct. 31, 2019

Related U.S. Application Data

(60) Provisional application No. 62/662,580, filed on Apr. 25, 2018.

(51) Int. Cl.
*H01P 3/16* (2006.01)
*H01Q 1/22* (2006.01)
(Continued)

(52) U.S. Cl.
CPC .......... *H01P 3/16* (2013.01); *H01L 23/49822* (2013.01); *H01L 23/49838* (2013.01);
(Continued)

(58) Field of Classification Search
CPC ... H01P 3/16; H01P 3/08; H01P 5/087; H01Q 1/2283; H01Q 13/00; H01Q 1/526; H01Q 21/26; H01L 23/66; H01L 24/16; H01L 23/49838; H01L 23/49822; H01L 2924/19031; H01L 2223/6677; H01L 2223/6633; H01L 2223/6638;
(Continued)

(56) References Cited

U.S. PATENT DOCUMENTS

| 4,890,117 A | 12/1989 | de Ronde |
| 5,218,373 A | 6/1993 | Heckaman et al. |

(Continued)

FOREIGN PATENT DOCUMENTS

| CN | 201130710 | 10/2008 |
| EP | 0066015 | 12/1982 |

(Continued)

OTHER PUBLICATIONS

International Search Report for PCT/US2019/029146 dated Sep. 5, 2019.

*Primary Examiner* — Don P Le
(74) *Attorney, Agent, or Firm* — Ray A. King; Charles A. Brill; Frank D. Cimino

(57) ABSTRACT

A wave communication system includes an integrated circuit and a multilayered substrate. The multilayered substrate is electrically coupled to the integrated circuit. The multilayered substrate includes an antenna structure configured to transmit a circularly polarized wave in response to signals from the integrated circuit.

19 Claims, 7 Drawing Sheets

(51) Int. Cl.
*H01P 3/08* (2006.01)
*H01P 5/08* (2006.01)
*H01L 23/66* (2006.01)
*H01L 23/00* (2006.01)
*H01L 23/498* (2006.01)
*H01Q 13/00* (2006.01)

(52) U.S. Cl.
CPC .............. *H01L 23/66* (2013.01); *H01L 24/16* (2013.01); *H01P 3/08* (2013.01); *H01P 5/087* (2013.01); *H01Q 1/2283* (2013.01); *H01Q 13/00* (2013.01); H01L 2223/6633 (2013.01); H01L 2223/6638 (2013.01); H01L 2223/6677 (2013.01); H01L 2224/16227 (2013.01); H01L 2924/19031 (2013.01); H01L 2924/19039 (2013.01)

(58) Field of Classification Search
CPC . H01L 2224/16227; H01L 2924/19039; H01L 24/13; H01L 24/32; H01L 24/73; H01L 2224/81203; H01L 2924/00014; H01L 2224/13147; H01L 2924/14; H01L 2924/15321; H01L 2924/15174; H01L 2924/15184; H01L 2223/6627; H01L 2224/32225; H01L 2224/16225; H01L 2224/73204
USPC ......................................................... 343/772
See application file for complete search history.

(56) References Cited

U.S. PATENT DOCUMENTS

| | | | | |
|---|---|---|---|---|
| 6,421,012 B1* | 7/2002 | Heckaman | ............... | H01Q 1/38 343/700 MS |
| 6,850,130 B1* | 2/2005 | Gottl | ............... | H01P 1/184 333/156 |
| 7,623,073 B2* | 11/2009 | Teshirogi | ............... | H01Q 1/521 343/700 MS |
| 8,243,855 B2 | 8/2012 | Zarei | | |
| 9,048,546 B2* | 6/2015 | Tatarnikov | ......... | H01Q 15/0013 |
| 9,064,787 B2 | 6/2015 | Boeck et al. | | |
| 9,806,410 B2* | 10/2017 | Tatarnikov | ......... | H01Q 15/0013 |
| 2004/0056823 A1* | 3/2004 | Zuk | ............... | H01Q 9/27 343/895 |
| 2004/0095286 A1* | 5/2004 | Lee | ............... | H01Q 13/0258 343/786 |
| 2005/0052334 A1* | 3/2005 | Ogino | ............... | H01Q 9/30 343/866 |
| 2008/0218417 A1 | 9/2008 | Gillette | | |
| 2012/0032869 A1* | 2/2012 | Hawkins | ............... | H01Q 9/0045 343/857 |
| 2012/0088459 A1* | 4/2012 | Neto | ............... | H01Q 1/38 455/73 |
| 2012/0154241 A1* | 6/2012 | Tatarnikov | ............... | H01Q 1/48 343/848 |
| 2013/0321227 A1* | 12/2013 | Ratajczak | ............... | H01Q 21/0043 343/769 |
| 2014/0125544 A1* | 5/2014 | Tatarnikov | ......... | H01Q 15/0013 343/848 |
| 2014/0285294 A1 | 9/2014 | Haroun et al. | | |
| 2017/0077610 A1* | 3/2017 | Bongard | ............... | H01Q 21/24 |
| 2017/0237181 A1 | 8/2017 | Chen et al. | | |
| 2017/0331193 A1* | 11/2017 | Xue | ............... | H01Q 9/0457 |
| 2020/0170084 A1* | 5/2020 | Tymofieiev | ............ | H05B 6/687 |

FOREIGN PATENT DOCUMENTS

| | | |
|---|---|---|
| EP | 3244488 | 11/2017 |
| WO | 2012092521 | 7/2012 |
| WO | 2014153393 | 9/2014 |

\* cited by examiner

US 11,011,815 B2

1

CIRCULARLY-POLARIZED DIELECTRIC WAVEGUIDE LAUNCH FOR MILLIMETER-WAVE DATA COMMUNICATION

CROSS-REFERENCE TO RELATED APPLICATION

This application claims priority to, the benefit of the filing date of, and hereby incorporates herein by reference: U.S. Provisional Patent Application No. 62/662,580, entitled "LOW-LOSS CIRCULARLY-POLARIZED DIELECTRIC WAVEGUIDE LAUNCH FOR MILIMMETER-WAVE HIGH-SPEED DATA COMMUNICATION," filed Apr. 25, 2018.

BACKGROUND

This relates generally to high frequency data systems, and more particularly to high frequency data systems using dielectric waveguides to communicate electromagnetic waves that may convey data signals.

In many high frequency data systems, two alternative media are used for communicating high speed data, namely copper wires and optical cables. Each of these approaches, however, may have certain drawbacks. With respect to copper wires, one drawback is the skin effect, which occurs as frequency increases. Skin effect is the tendency of the alternating signal current to become distributed only near the outer perimeter (or skin) of the wire, which raises the wire impedance and causes considerable signal loss at high frequencies. Optical cables are effective for long-distance spans, so long as the signal remains in the optical cable; however, connectivity to an intermediate or terminal device causes loss, and certain environments may have issues, such as debris or vibration, which can severely limit or disrupt optical cable communication efficiency. Further, optical cable can be relatively expensive to implement, and it also may be expensive in terms of power consumption of the attendant communicating circuitry/system.

A dielectric waveguide (DWG) is a high frequency alternative to copper wires and optical cables. A waveguide is a structure that guides waves, including electromagnetic waves that can carry data. The following patents are hereby incorporated herein by reference: (a) U.S. Pat. No. 9,761,950, issued Sep. 12, 2017, entitled "Dielectric Waveguide With Embedded Antenna"; (b) U.S. Pat. No. 9,705,174, issued Jul. 11, 2017, entitled "Dielectric Waveguide Having A Core and Cladding Formed In A Flexible Multi-Layer Substrate"; and (c) U.S. Pat. No. 9,647,329, issued May 9, 2017, entitled "Encapsulated Molded Package With Embedded Antenna For High Data Rate Communication Using A Dielectric Waveguide."

SUMMARY

A wave communication system includes an integrated circuit and a multilayered substrate. The multilayered substrate is electrically coupled to the integrated circuit. The multilayered substrate includes an antenna structure configured to transmit a circularly polarized wave in response to signals from the integrated circuit.

DETAILED DESCRIPTION

Figure 1A:
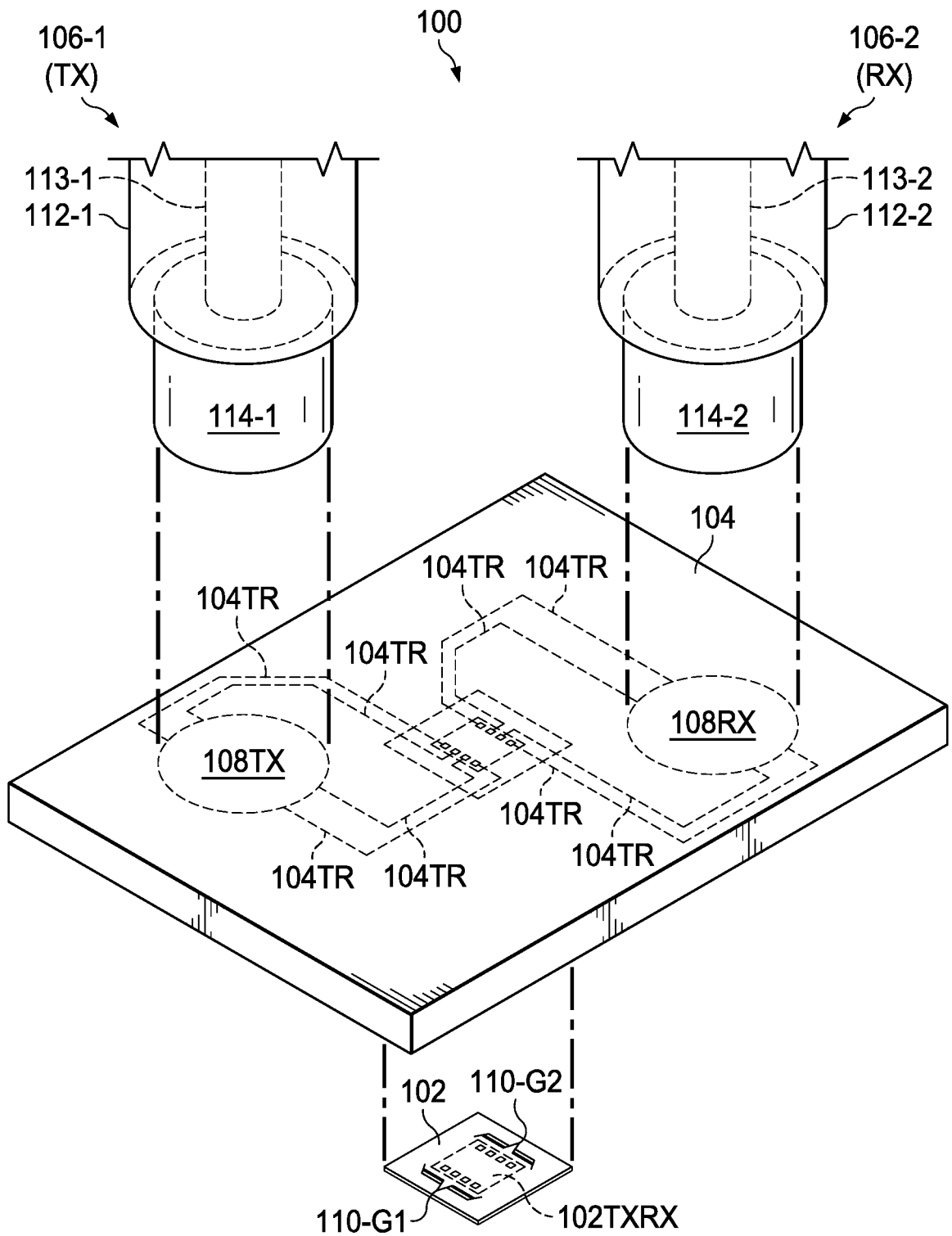
FIG. 1A is an exploded partial view of a dielectric waveguide system.

FIG. 1A is an exploded partial view of a dielectric waveguide (DWG) communication system 100. System 100 includes an integrated circuit (IC) die 102, a multilayered substrate 104, and a transmit (TX) and receive (RX) DWG cable assembly 106-1 and 106-2, respectively, with physical attachment and electrical couplings between these devices. IC die 102 is physically attached to a first side (e.g., bottom) of multilayered substrate 104, such as by die mount techniques. Both of TX and RX cable assemblies 106-1 and 106-2 physically attach to a side (e.g., top) of multilayered substrate 104 opposite IC die 102, by a mechanism, such as screws, clips, mounts, or the like. TX cable assembly 106-1 is axially aligned relative to a transmit region 108TX on substrate 104, and RX cable assembly 106-2 is axially aligned relative to a receive region 108RX on substrate 104. With such alignment and the further attachment of substrate 104 to IC die 102, millimeter electromagnetic waves may communicate between cable assemblies 106-1 and 106-2, from and to IC die 102, with such waves communicated by both antennas (and respective feed structures), and waveguides, constructed in multilayered substrate 104.

IC die 102 may have attributes and sizing of integrated circuit technology, such as where IC die 102 is a 3 mm×3 mm square. IC die 102 includes a transceiver shown generally as transceiver 102TXRX (connections not separately shown) configured to transmit and receive signals. The operating frequencies and bandwidth of the transceiver signals may be selected according to application, such as for communicating along DWG media in the millimeter wave range (e.g., 110 to 140 GHz). While not separately shown, transceiver 102TXRX may include one or more processors (e.g., digital signal processor) and support multiple transmit and receive channels, radio configuration, control, calibration, and programming of model changes for enabling a wide variety of implementations. IC die 102 includes a number of conductive members, such as die pads, shown generally in groups 110-G1 and 110-G2. Conductive areas 110-G1 and 110-G2 (e.g., die pads) are physically positioned to align with conductive areas (e.g., pads below) substrate transmit and receive regions 108TX and 108RX, respectively, so conductors (e.g., copper pillars or other bump structures) may be electrically between opposing ones of such areas. Accordingly, when IC die 102 is affixed physically relative to multilayer substrate 104, it likewise is electrically coupled to electrical paths of substrate 104, including traces 104TR, for electric connection between IC die 102 and regions 108TX and 108RX. Through this electrical coupling, millimeter wave signals may be communicated between IC die 102 and antennas constructed within multilayer substrate 104, as described below.

Cable assemblies 106-1 and 106-2 each include a respective dielectric cable 112-1 and 112-2, such as a cylindrical outer cladding concentrically surrounding a respective cylindrical inner core 113-1 and 113-2, but other cable configurations including a dielectric are also possible. The outer cladding has a dielectric constant ε(OC), and the inner core has a dielectric constant ε(IC). The diameter of the outer cladding may be in the range of 3 to 6 mm, and the diameter of the inner core may be in the range of 1.5 to 2 mm. Preferably, the inner core dielectric constant ε(IC) is sufficiently greater than the outer cladding constant ε(OC), so that a millimeter wave may be coupled to the cable, and its energy will be concentrated in the inner core. In this manner, even though the cable material is dielectric in nature, which is often insulating in nature, the dielectric will allow energy to travel along it, whereas an insulator will not pass charge. Accordingly, example embodiments permit use of relatively inexpensive dielectric materials for the cable core, such as polyethylene, and in connection with system 100 may efficiently communicate millimeter wave signals from transceiver 102TXRX to cable 112-1, and thereby to a device (not shown) at the distal end of the cable. Also, in this regard, each of cable assemblies 106-1 and 106-2 also includes a respective metal waveguide coupler 114-1 and 114-2. In an example embodiment, each waveguide coupler 114-$x$ has a cylindrical shape, having a height such as 1.5 mm and a center axis that aligns with the center axis of the core 113-$x$, with both axes to align with a respective one of regions 108TX and 108RX. The outer diameter of a cable 113-$x$ may vary and may exceed the outer diameter of a corresponding waveguide coupler 114-$x$ as shown in the illustrated example, while the outer diameter of a core 113-$x$ is less than the inner diameter of a corresponding waveguide coupler 114-$x$. With such dimensions and axial alignments, the circular inner diameter of each waveguide coupler 114-$x$ physically aligns with a respective transmit or receive region 108TX and 108RX, and the cylindrical shape provides a circular cross-section for both physically and wave coupling to transmit and receive regions 108TX and 108RX. Also, in example embodiments, wave communication in system 100 is by circular polarization, so the metallic circular cross-section of each waveguide coupler 114-$x$ assists to guide the circularly-polarized wave between the dielectric cable inner core 113-$x$ and multilayered substrate 104.

Figure 1B:
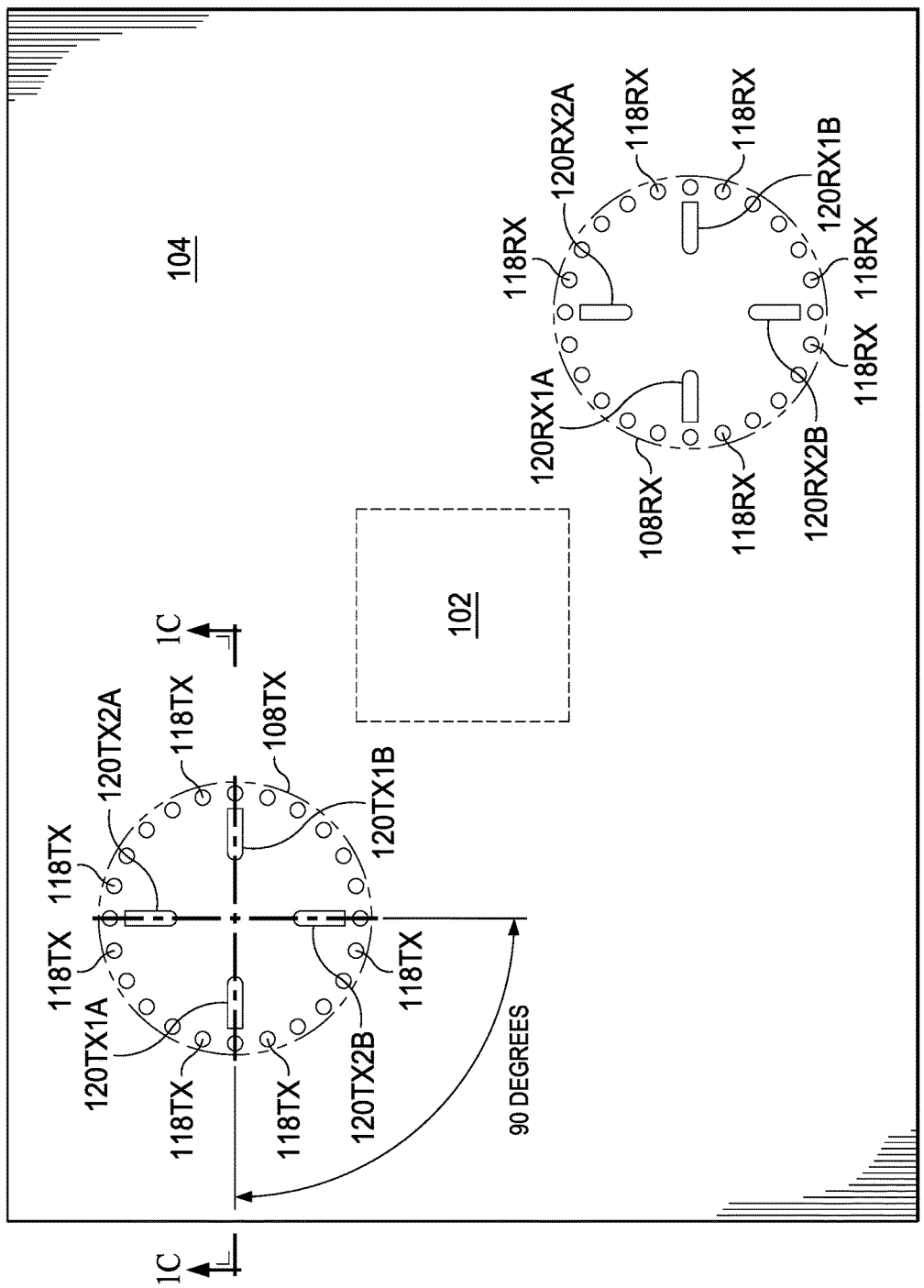
FIG. 1B is a plan view of multilayered substrate and integrated circuit (IC) die.

FIG. 1B is a plan view of multilayered substrate 104, with IC die 102 shown by a dashed rectangle, being positioned beneath substrate 104 in the view. In the plan view, each of transmit region 108TX and receive region 108RX of substrate 104 is further illustrated, and example features in the top metal layer of substrate 104 are shown. For example, in transmit region 108TX, just inside the perimeter of region 108TX, a number of via waveguide tops 118TX are located. Similarly, in receive region 108RX, just inside the diameter of region 108RX, a number of via waveguide tops 118RX are located. Each via waveguide top 118 is a metal pad, of a same shape (e.g., circular), in the top metal layer of substrate 104. Further, via waveguide tops 118 are equally and circumferentially spaced, where the number of tops 118 may be selected according to particular implementations. The illustrated example has a total of 24 such via waveguide tops 118, each equally spaced 15 degrees apart (360 degrees/24 tops=15 degree spacing) from neighboring tops. Further, the spacing applies to the central portion of each top 118, so that with a higher density and/or larger top in an alternative embodiment, each top may touch a neighboring top. As described below, collectively the entirety of via waveguide tops in either region 108TX or 108RX provides a tapered waveguide, between the region and a respective one of cable assemblies 106-1 and 106-2.

Within the interior of the circle presented by the equally-spaced via tops 118TX or 118RX are positioned four antennas. For example, transmit region 108TX has four transmit antennas 120TX1A, 120TX1B, 120TX2A and 120TX2B, each having a comparable and generally rectangular (with a rounded end) member physically positioned and aligned preferably 90 degrees apart from each other. Similarly, receive region 108RX has four receive antennas 120RX1A, 120RX1B, 120RX2A, and 120RX2B, each also physically positioned preferably 90 degrees apart from each other. As described below, for a set (either transmit or receive) of antennas, a coupler (e.g., branchline or other quadrature, such as in substrate 104), couples a differential signal between IC die 102 and additional feed structure to those antennas, so that a circularly polarized signal is either transmitted by, or received from, the antennas. The signal is further guided by waveguides that include waveguide via tops 118, so that the signal is either transmitted to, or received from, a direction generally perpendicular from the plane illustrated in FIG. 1B (out of the page). Accordingly, the signal energy is efficiently coupled between substrate 104 and a respective cable assembly 106-$x$.

Figure 1C:
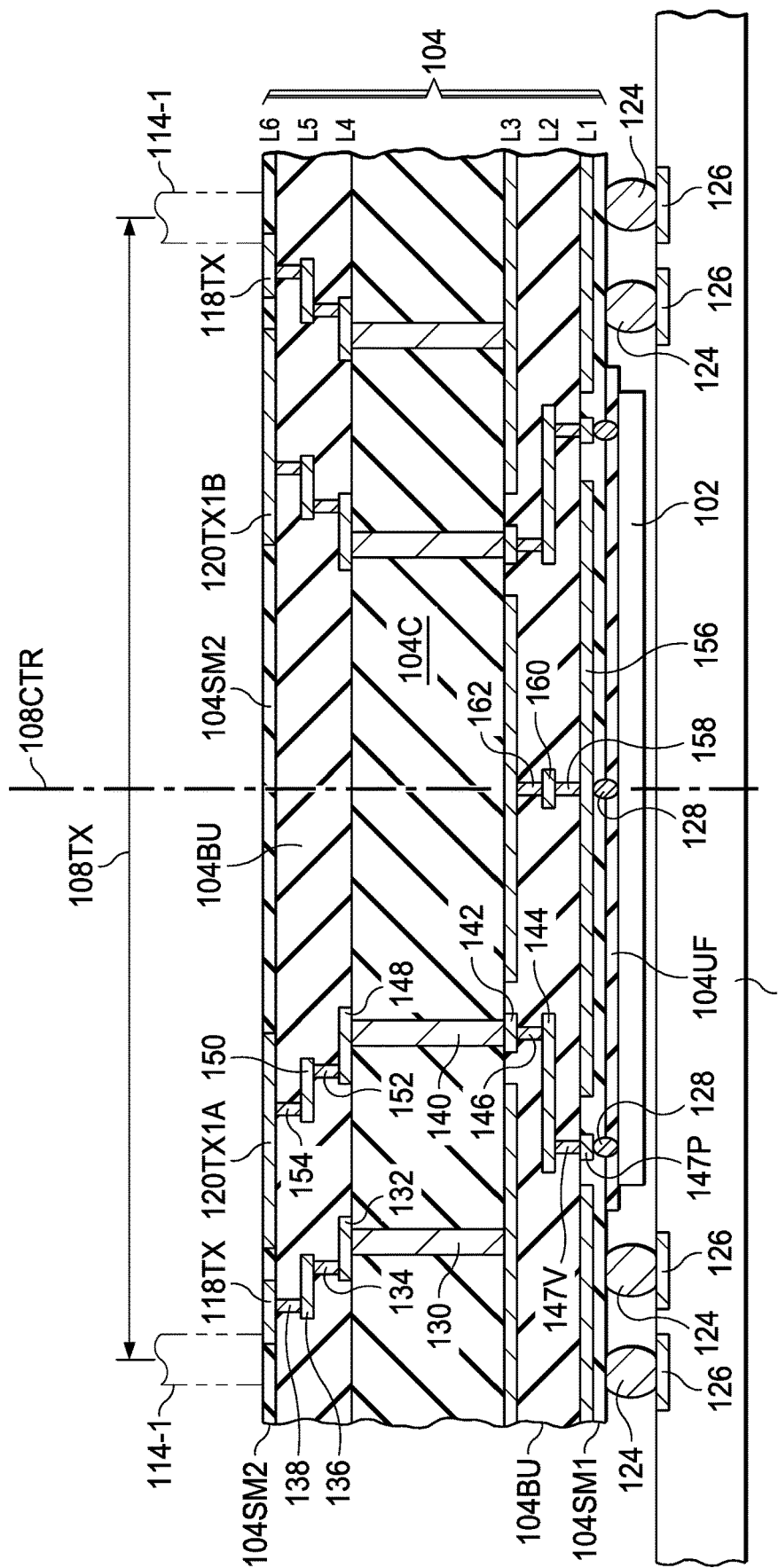
FIG. 1C is a cross-sectional view taken in part along line 1C-1C, from FIG. 1B.

FIG. 1C is a cross-sectional view of portions of system 100 taken in part along line 1C-1C, across region 108TX from FIG. 1B. A similar view would be presented if taken across region 108RX. Generally, FIG. 1C shows substrate 104 physically and electrically connected to a circuit substrate 122, such as a printed circuit board (PCB). For example, this electrical connection may be accomplished using ball grid array (BGA) balls 124 connected to pads 126 on PCB 122. As described above, IC die 102 is connected electrically and physically beneath substrate 104. This electrical connection may be achieved electrically by die bumps such as copper pillars 128 between IC conductive areas 110 and contacts (see FIG. 1A) along a bottom of substrate 104, and the physical connection by various die bonding techniques, such as thermo-compression. Also, an underfill 104UF is placed between die 102 and substrate 104. Dashed vertical lines in the top left and right of FIG. 1C indicate a desired position for metal waveguide coupler 114-1, which may be affixed relative to an upper surface of substrate 104, encircling transmit region 108TX, and either directly in contact with substrate 104 (and to antennas therein as described below) or with a slight air gap (e.g., 0.1 mm) between the two structures.

Multilayered substrate 104 has a cross-sectional profile generally consistent with evolving technologies for substrate packaging. In the illustrated example, substrate 104 includes six metal layers, referenced in ascending order from the bottom of substrate 104 upward, as layers L1 through L6. Also, for example, each metal layer L1 through L6 may have a same thickness (such as 15 μm), although metal layer thickness may vary, but desirably (for thermal expansion matching) with a same thickness for each layer a same distance from center core 104C (layers L3 and L4 having a same thickness; layers L2 and L5 having a same thickness; layers L1 and L6 having a same thickness). Between successive metal layers are non-conducting materials, which are not referred to herein as layers, but which are also layered (structurally) as between metal layers. For example, a center core 104C exists between metal layers L3 and L4, which is thicker than the non-conducting materials between other metal layers. Also, for example, center core 104C may be 200 μm thick, while the non-conducting materials between other metal layers (usually referred to as build-up 104BU) may be 30 μm thick. Build-up 104BU is desirably a material with low loss, and with each layer of such material having a same or similar dielectric constant. Solder masks 104SM1 and 104SM2 are respectively below metal layer L1 and above metal layer L6.

FIG. 1C also illustrates additional structure (in substrate 104) that form a portion of via waveguide tops 118TX in FIG. 1B. Specifically, a via 130 is formed through center core 104C, such as forming a cylindrical void through core 104C and then filling or plating it with a conductive material (e.g., metal), where the void may have a cross-sectional diameter of 90 μm. Via 130 also provides electrical contact to metal in layer L3. Above via 130, metal layer L4 is patterned to form a pad 132, such as with a circular perimeter and a diameter of 130 μm. A build-up 104BU is formed over pad 132 (and above other portions of metal layer L4), and a via 134 is formed in that build-up (e.g., forming a cylindrical void through the build-up above layer L4, and filling or plating it with conductive material). Via 134 may have a cross-sectional diameter of 60 μm, and it provides electrical contact to pad 132. Similarly, above via 134, metal layer L5 is patterned to form a pad 136 of like shape, but smaller diameter (e.g., equal to 100 μm), than pad 132. A build-up 104BU is formed over pad 136 (and above other portions of metal layer L5), and a via 138 is formed in that build-up 104BU, with a same technique and diameter as via 134. Also, metal layer L6 is patterned to form waveguide top 118TX, in physical and electrical contact to via 138. Accordingly, waveguide top 118TX is part of a physical structure, and electrical path, that includes the various items and paths through at least metal layers L6 to L3. Further, that structure and path are tapered so that: near the bottom of substrate 104, the shape/path starts nearer to the center 108CTR of region 108TX; and moving upward, it bends radially outward from that center. This same structure is repeated for each waveguide top 118TX, again referring to FIG. 1B. That example illustration has a total of 24 waveguide tops 118TX inside but adjacent the perimeter in transmit region 108TX, thereby collectively forming a substrate-integrated, communication region (either transmit or receive) perimeter waveguide. Specifically, each waveguide top 118TX corresponds to a structure as shown in FIG. 1C, tapering from the top downward and toward the center of the transmit region. The combination of all such structure, across all (e.g., 24) perimeter-positioned waveguides, provides a generally funnel-type physical profile within substrate 104, widest at the top of substrate 104 (e.g., at layer L6), and tapering inward toward the bottom of substrate 104 (e.g., at layer L2). Further, a generally-circular (or piecewise linear approaching a circle) outer boundary may be defined along the outermost tangent of the circular shape of each waveguide top 118TX. That outer boundary generally aligns within, or coincides with, the interior of perimeter metal waveguide coupler 114-1. Accordingly, as signals are transmitted by antennas 120TX, the funnel-type structure provides a region perimeter waveguide, guiding the signal wave generally in a direction perpendicular from the upper surface of substrate 104, and from FIGS. 1A and 1C, into the interior of metal waveguide coupler 114-1. Such a tapering waveguide may reduce loss as the signal passes between mismatched impedance materials. Although such waveguide structure and functionality are described above with respect to the transmit region 108TX, the receive region 108RX (in an example embodiment) has the same structure. Accordingly, as a signal wave is received from metal waveguide coupler 114-2, that signal is guided downward through substrate 104, by the inward tapering of a funnel-like waveguide therein and to IC die 102.

FIG. 1C also illustrates additional feed structure in substrate 104 that feeds the illustrated transmit antennas 120TX1A and 120TX1B (applying likewise to antennas 120TX2A and 120TX2B, which are not visible in the cross-section). Specifically, a via 140 is formed through center core 104C, which may be formed of same dimensions and materials, and concurrently with, via 130 described above in connection with via waveguide top 118TX. Via 140 also provides electrical contact to metal in layer L3, where a metal pad 142 is formed in layer L3 by forming an annulus opening in metal layer L3, so metal pad 142 remains at the center of the annulus, with an open area 142A in metal layer L3 (eventually filled with build-up) concentrically around metal pad 142. In this way, the antenna-related structure is otherwise isolated from other connections to layer L3, permitting a signal path connection by way of a signal coupler, described below. Also in this regard, metal pad 142 is connected to a conductor portion 144 of metal layer L2, by way of a via 146. Conductor portion 144 is a part of the signal coupler, which communicates with IC die 102 by an additional via 147V and metal layer L1 pad 147P. Returning to via 140, above it metal layer L4 is patterned to form a pad 148, metal layer L5 is patterned to form a pad 150, and respective layer L4-to-L5 and L5-to-L6 vias 152 and 154 are formed through build-up 104BU, all of which may be comparably and concurrently formed with respective metal layer (and build-up) formation of horizontally co-planar structure described above in connection with via waveguide top 118TX. Via 154 thus provides electrical contact to transmit antenna 120TX1A, completing the structure and electrical path for that antenna in substrate 104. Accordingly, below transmit antenna 120TX1A in substrate 104, an overall physical antenna feed structure provides an electrical path through various items and includes at least metal layers L5 to L2. Preferably, this structure has a total vertical height, from the top of metal layer L2 to the bottom of metal layer L6, of $\lambda/4$, where from above $\lambda$ is the wavelength of the signal to be transmitted/received by coupler 200. Further in this regard, for applications at even higher frequencies, $\lambda$ is therefore proportionately reduced, allowing the antenna height to reduce and be built with less space inside substrate 104; in such an example, extra room in substrate may be available for embedding IC die 102 internally within substrate 104, rather than being physically attached to an exterior surface (e.g., to the bottom) of substrate 104. Further, the antenna structure includes portions nearer the substrate lower surface (pad 142 and via 140) that are nearer to the center 108CTR of region 108TX than other portions that extend toward the substrate upper surface. Such a structure may reduce loss from signal communication and avoid or minimize the effects of impedance mismatch incurred in the transmitting (or receiving) signal paths. However, as the structure and signal path is considered vertically upward through substrate 104, the final signal transmitting (or receiving in the case of region 108RX) portion of transmit antenna 120TX1A is more favorably distanced from transmit antenna 120TX1B (and from the other two transmitting antennas 120TX2A and 120TX2B), thereby reducing possible cross-talk between transmitted (or received) signals. Although such antenna structure and functionality are described above with respect to the transmit region 108TX, the receive region 108RX (in an example embodiment) has the same structure.

FIG. 1C also illustrates additional structure in substrate 104 that forms a signal block structure, preferably connecting metal layer L1, usually electrically grounded, to metal layer L3. Specifically, such structure includes a metal pad 156 in layer L1, a via 158 from metal pad 156 to a layer L2 metal pad 160, and a via 162 from metal pad 160 to the general plane of layer L3. As further illustrated and described below, this structure is repeated and positioned in numerous selected locations between the four signal antennas.

Figure 2:
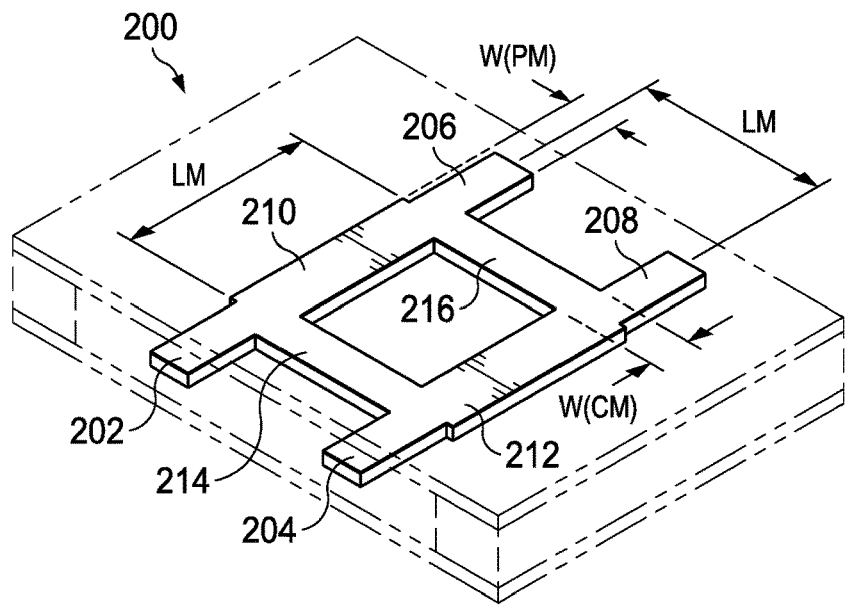
FIG. 2 is a perspective view of a branchline coupler.

FIG. 2 is a perspective view of a branchline coupler 200, formed in an example embodiment in layer L2 of substrate 104. Accordingly, the coupler 200 structures are formed, such as by patterning metal in layer L2 into desired striplines, and with buildup 104BU surrounding the L2 structures. As described above in connection with FIG. 1B and further described below, a coupler couples a differential signal from IC die 102 to antennas 102TX (and also from antennas 102RX to IC die 102), and branchline coupler 200 is an example of such a coupler. More particularly, coupler 200 has an input port 202 and an isolated port 204, and two output ports 206 and 208. Input port 202 is connected through a first path member 210 to output port 206, and isolated port 204 is connected through a second path member 212 to output port 208, where the example illustrates members 210 and 212 as linear striplines. A first cross path member 214 is connected between input port 202 and isolated port 204, and a second cross path member 216 is connected between output ports 206 and 208, where the example illustrates members 214 and 216 also as linear striplines. Each of first path member 210, second path member 212, first cross-path member 210, and second path member 212, has a length LM of $\lambda/4$, where from above $\lambda$ is the wavelength of the signal to be transmitted/received by coupler 200. Each of first and second cross-path members 214 and 216 is formed to have a same impedance Z(CM), and each of first and second path members 210 and 212 is formed to have a same impedance Z(PM), where $Z(PM)=Z(CM)/\sqrt{2}$. For example, such impedances may be achieved by forming first and second path members 210 and 212 to each have a width W(PM) wider than the matching width W(CM) of first and second cross-members 214 and 216.

Figure 3:
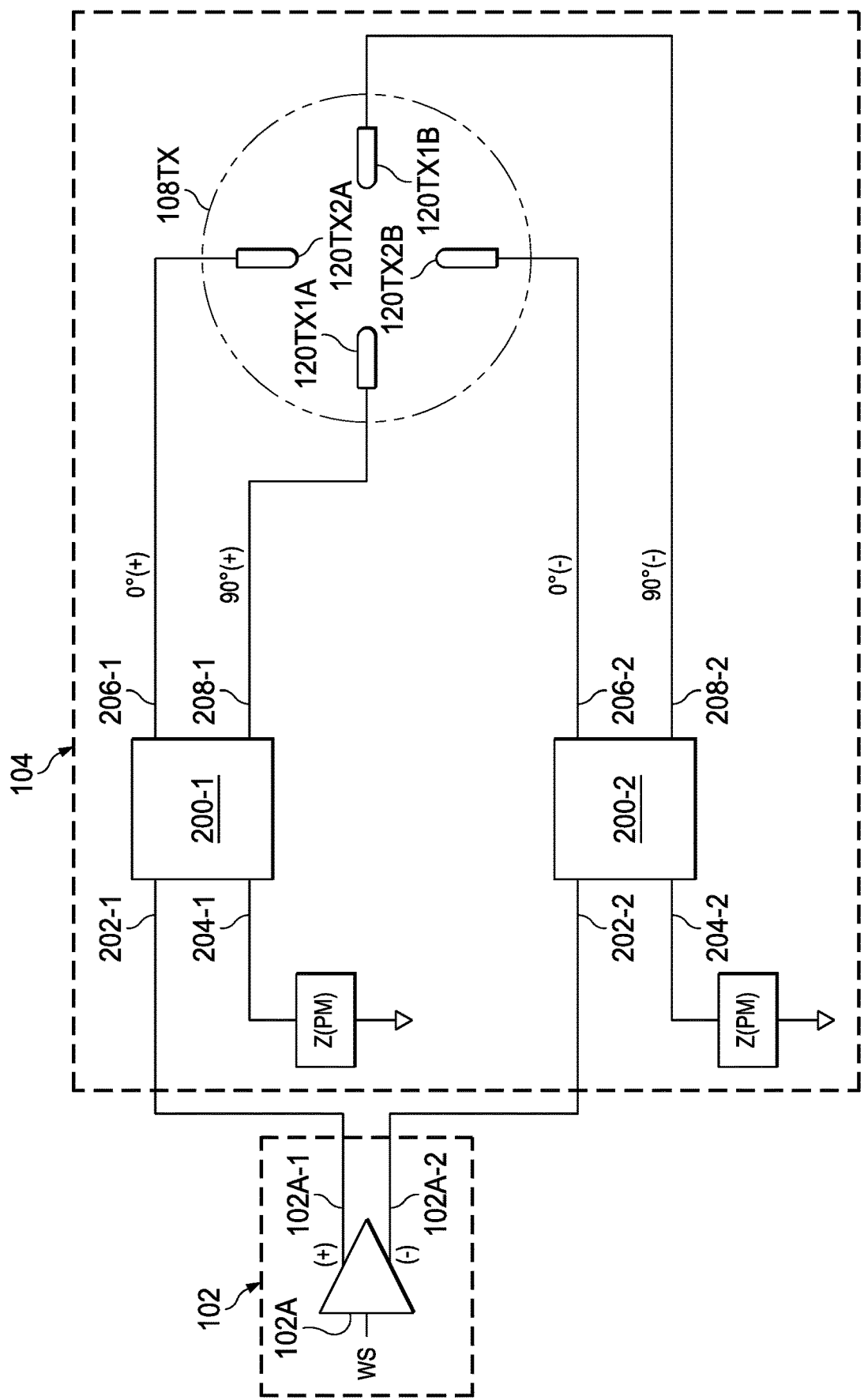
FIG. 3 is a schematic diagram of a signal path from an IC die, through two branchline couplers, to four transmit antennas.

FIG. 3 is a schematic diagram of a signal path from IC die 102, through two branchline couplers 200-1 and 200-2 (e.g., FIG. 2), to the four transmit antennas 120TX1A, 120TX1B, 120TX2A, and 120TX2B of region 108TX (FIG. 1B). For reference convention, like numbers are carried forward from FIG. 2 to FIG. 3, with the addition of either a hyphenated 1 or 2, so as to distinguish connections to either of couplers 200-1 and 200-2, respectively. Transceiver 102TXRX (FIG. 1A) includes various circuitry for transmitting and receiving a millimeter-wave signal, such as from a differential amplifier 102A. Differential amplifier 102A provides differential outputs 102A-1 and 102A-2, which are shown in FIG. 3 with a respective (+) and (−) designation, depicting the differential nature of the output and depicting that the outputs signals are out of phase by 180 degrees. Output 102A-1 is connected to input 202-1 of coupler 200-1, and output 102A-2 is connected to input 202-2 of coupler 200-2. Isolated ports 204-1 and 204-2, of couplers 200-1 and 200-2, respectively, are connected through a matched termination impedance (e.g., Z(PM)) to ground. Output 206-1 of coupler 200-1 is connected to antenna 120TX2A, and output 208-1 of coupler 200-1 is connected to antenna 120TX1A, which is both physically oriented and electrically coupled to provide a signal, 90 degrees apart from a concurrent signal from antenna 120TX2A. Output 206-2 of coupler 200-2 is connected to antenna 120TX2B, and output 208-2 of coupler 200-2 is connected to antenna 120TX1B, which is both physically and electrically coupled to provide a signal, 90 degrees apart from a concurrent signal from antenna 120TX2B.

The operation of the FIG. 3 schematic is described below. Within IC die 102, transmitter circuitry generates a millimeter wave signal WS, which is output to differential amplifier 102A. In response, amplifier 102A outputs 180 degree separated versions of the input signal (possibly filtered and/or amplified) at its differential outputs 102A-1 and 102A-2. Each of branchline couplers 202-1 and 202-2 operates to receive one input and to produce corresponding 90 degree phase separated outputs. With respect to branchline coupler 200-1, its two outputs are shown at 0° (+) and 90° (+), indicating correspondence to the (+) signal of output 102A-1, and being 90 degrees separated from one another. Thus, output 0° (+) may be perceived as a first unit-length vector located at 0 degrees in a positive direction (usually to the right of the origin in polar coordinates), and output 90° (+) may be perceived as a second unit-length vector located at +90 degrees relative to the first vector. Similarly, with respect to branchline coupler 200-2, its two outputs are shown at 0° (−) and 90° (−), indicating correspondence to the (−) signal of output 102A-2, and being 90 degrees separated from one another. Thus, output 0° (−) may be perceived as a third unit-length vector located at 0 degrees in a negative direction (usually to the left of the origin in polar coordinates), and output 90° (−) may be perceived as a fourth unit-length vector located at either −90 degrees relative to the first vector or +90 degrees relative to the third vector. Accordingly, collectively FIG. 3 encodes the input signal into four waveform vectors, each spaced equally at 90 degree distances, and so that each of four different 90 degree positions is occupied by a respective waveform vector. Accordingly, the four FIG. 3 antennas collectively produce a circular polarization output, so that as the input millimeter wave signal WS to amplifier 102A varies, each of the resultant four vectors has a constant magnitude, but rotates with time in a plane perpendicular to the plane along which the tops of transmit antennas 120TX1A, 120TX1B, 120TX2A and 120TX2B are aligned. With reference to FIG. 1C, therefore, the circular polarization signal rotates perpendicularly upward from substrate 104, and into the interior of waveguide coupler 114-1. Rotation may be either left-handed or right-handed polarization. In a similar but reverse direction, receive antennas 120RX1A, 120RX1B, 120RX2A and 120RX2B are configured to receive four signal components (one per antenna) of a circular polarization signal from waveguide coupler 114-1, and those signal components are connected to comparable components as FIG. 3 in reverse direction, so as to decode from the signal components a corresponding output signal representative of the received millimeter wave signal.

The circular polarization achieved by the described physical and electrical structure for an example embodiment provides various benefits. In contrast, for proper signal communication, linear polarization requires a fairly precise planar linear alignment with the signal and a receiver of that signal. Also, in contrast, the example embodiment provision of circular polarization removes the need for such planar alignment. For example, with respect to FIG. 1, as a DWG cable assembly 106-x is positioned relative to substrate 104, the circular cross-section of the cable is not required to be rotationally aligned to a particular position relative to substrate 104 for signal communication purposes. Accordingly, rotational independence is achieved about the axis of each cable, relative to the transmit/receive structure in substrate 104. As another example, the circularly-polarized signal incurs less signal loss in certain environments, such as those with vibrations, turns, or gaps in connectivity.

Figure 4:
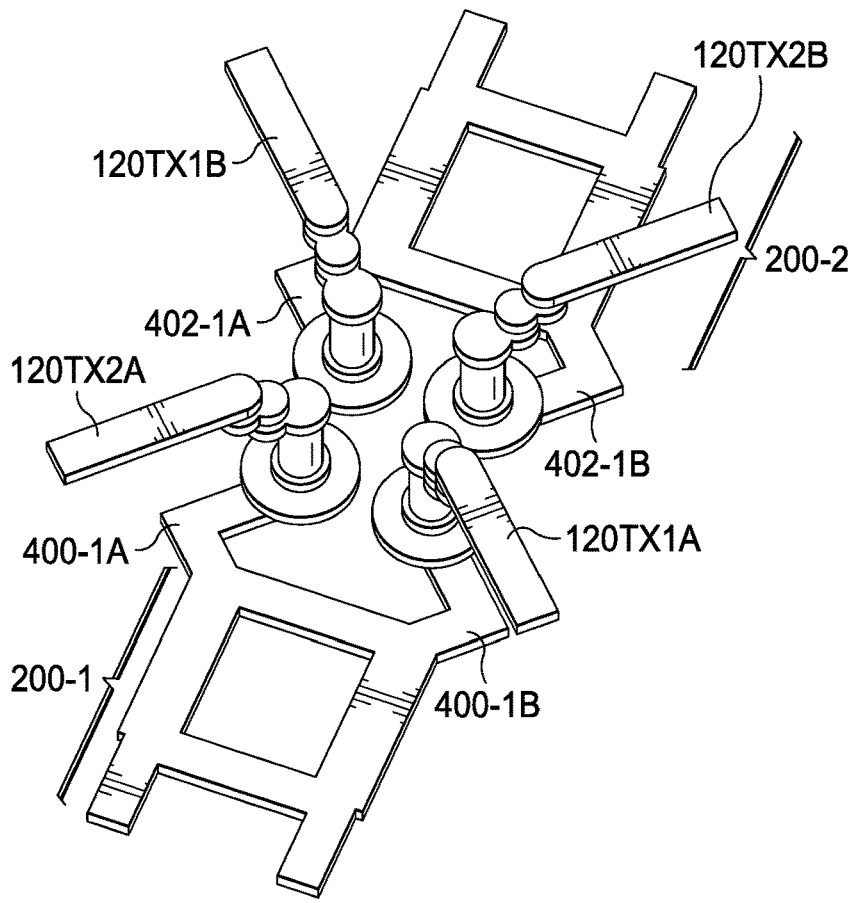
FIG. 4 is a perspective view of certain wave transmit/receive signal path substrate components.

FIG. 4 is a perspective view of certain wave transmit/receive signal path components of substrate 104, representing in greater detail a view of either transmit region 108TX or receive region 108RX from FIG. 1B. From FIG. 4, and as described above, region 108TX (or 108RX) includes two branchline couplers 200-1 and 200-2, which may be formed in metal layer L2 (see FIG. 1C). Each of branchline couplers 200-1 and 200-2 is connected to a respective transmission line pair 400-1A and 400-1B, or 402-1A and 402-1B. Each transmission line pair preferably has a first and second portion, with an angle (e.g., 90 degrees) between the portions. Further, the termination of each such pair provides two signals, which are 90-degrees apart, to a respective pair of conductive paths, formed by vias and pads (see FIG. 1C), thereby providing electrical signal path communication between branchline coupler 200-1 to antennas 120TX2A and 120TX1A, and between branchline coupler 200-2 to antennas 120TX2B and 120TX1B. The FIG. 4 perspective view also demonstrates that the L6 layer portion of each antenna has a uniform width, other than the rounded end positioned above the L4-to-L5 via.

Figure 5:
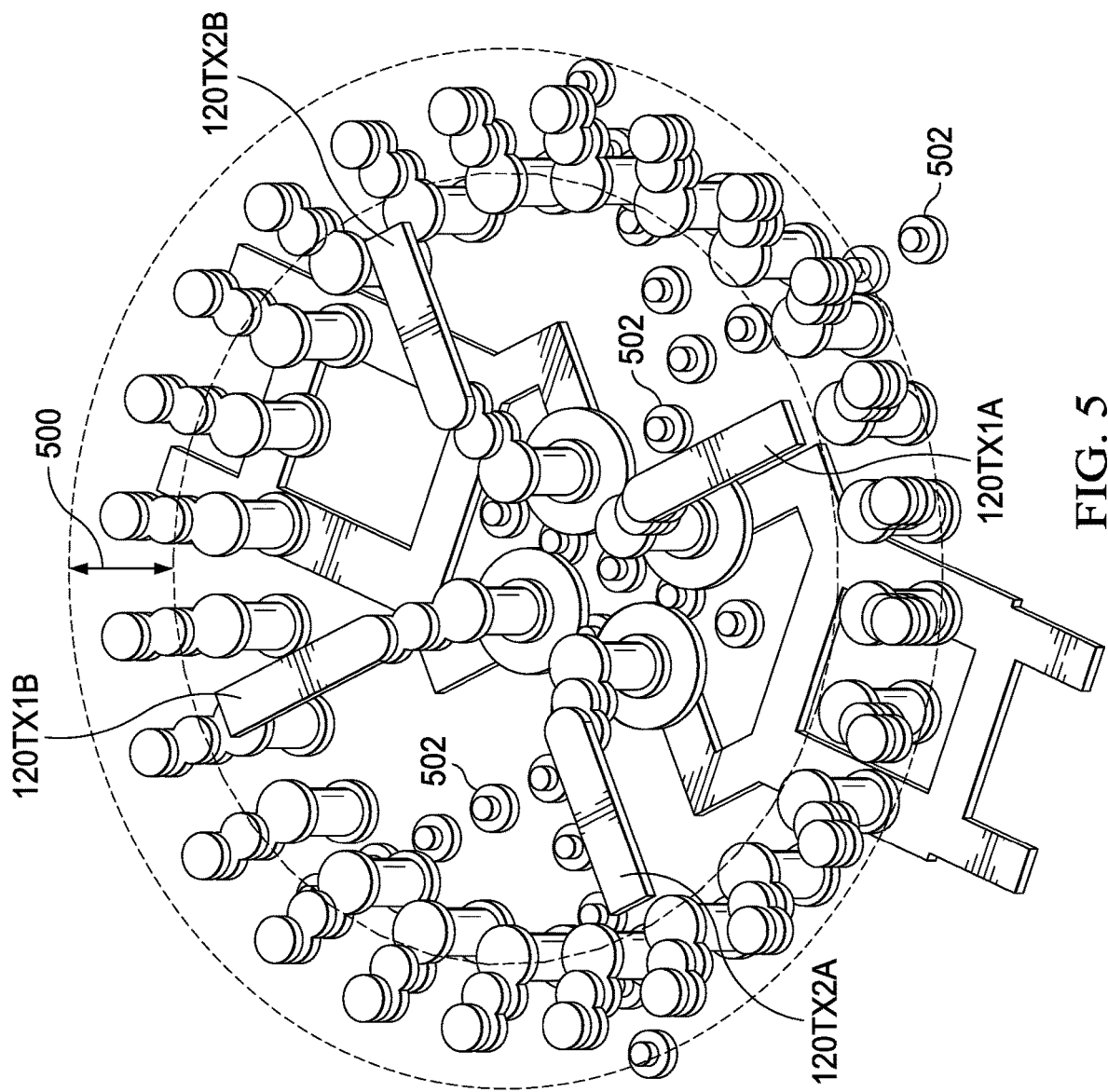
FIG. 5 is the perspective view of FIG. 4, with additional waveguide and isolation structure.

FIG. 5 is the perspective view of FIG. 4, with additional structure. One addition of FIG. 5 is the structure forming the region (either transmit or receive) perimeter waveguide 500, shown generally in FIG. 5 by concentric dashed ovals. Numerous of the via waveguide tops 118TX are between those ovals, and the radially inwardly-tapered vias and pads are connected to each such top, as shown in FIG. 1C. According to this view, the collective funnel-shaped waveguide 500 is based on such structures. Another addition of FIG. 5 is a perspective view of a number of signal block structures 502, which include numerous instances of the metal layer L2 to L3 connecting structures 156, 158, 160 and 162, as shown in FIG. 1C. In the illustrated embodiment, signal block structures 502 are positioned in an opposing letter-Y pattern between each pair of antennas connected to a respective branchline coupler, and with a few (e.g., four) additional structures 502 bisecting the opposing letter-Y pattern. Ground structures 502 provide further signal isolation in signal communication between each branchline coupler and the two antennas to which it is connected. Further, structure 502 may be positioned in alternative positions and/or other substitutes may be used, such as forms of signal isolation including electromagnetic bandgap (EBG) or high impedance surface (HIS) structures.

Figure 6:
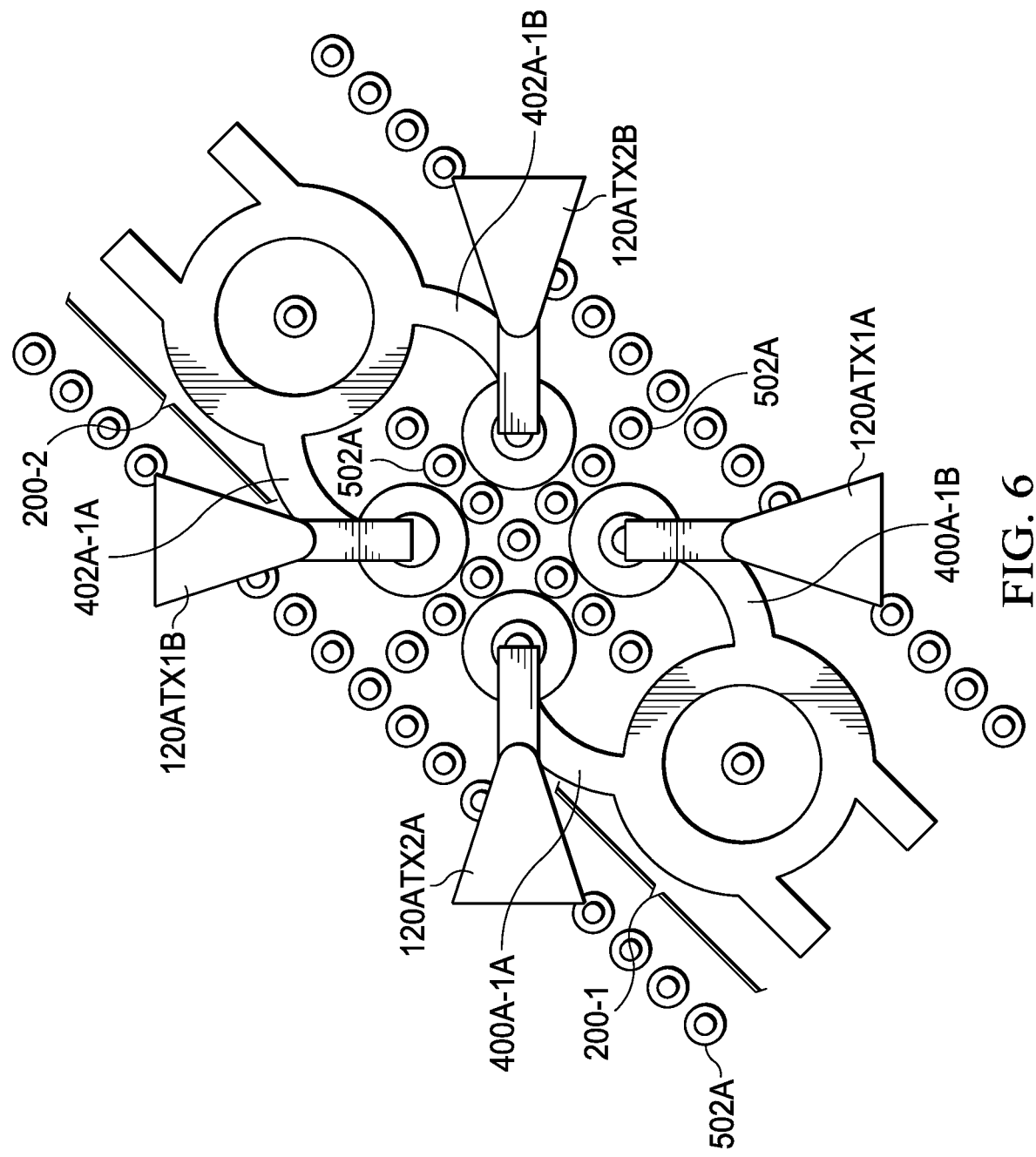
FIG. 6 is a plan view of an alternative structural example of a transmit or receive region, with shape alterations made in the antennas, branchline couplers, and signal block structures.

FIG. 6 is a plan view of an alternative example for structure to form a region 108 (either transmit 108TX or receive 108RX), with shape alterations made in the antennas, branchline couplers and signal block structures. Accordingly, any one or more of such structures may be modified, providing alternative example embodiments. For example, alternative branchline couplers 200A-1 and 200A-2 are shown (in which the above-described linear striplines are replaced with a rounded signal path) having arcuate segments, because in such an example embodiment the avoidance of turns or other discontinuities in shape may reduce signal loss. As another example, transmission line pair 400-1A and 400-1B, or 402-1A and 402-1B, are replaced with rounded transmission line pairs 400A-1A and 400A-1B, or 402A-1A and 402A-1B. As another example, the bisected opposing letter-Y pattern of signal block structures 502 between each pair of antennas connected to a respective branchline coupler are replaced with a bisected H-shaped pattern of signal block structures 502A. And as yet another example, the uniform width (other than rounding above the L6-to-L5 via) of the antennas is replaced with an increasing width (referred to as conical) set of antennas 120ATX1A, 120ATX1B, 120ATX2A, and 120ATX2B.

From the description above, numerous example embodiments provide a millimeter-wave high-speed data communication system, and various benefits are possible. For example, different embodiments of the system may have various aspects, including an integrated circuit transceiver coupled via one or more couplers, which couple the signal to antennas, with the couplers and antennas embedded in a substrate. The embedded substrate apparatus provides a waveguide launch, configured to radiate an electromagnetic wave signal in a relatively narrow and controlled direction from the substrate, such as away from its surface and to couple into one or more DWG cable assemblies. The cable assemblies can include dielectric material, providing a dielectric waveguide to further communicate the electromagnetic wave signal to and from apparatus at a distal end of the cable assemblies. Also, the electromagnetic wave signal may be communicated as a circularly-polarized signal, given the structure described and with the benefits of such a signal, such as reduced signal loss and reduced need for precision alignment at terminal ends of the cable carrying the signal. Moreover, example embodiment may reduce group delay, which is a measure of the respective delay in different frequency components of a signal as the signal passes along a device or system, where ideally those delays are equal or near equal, providing a relatively flat group delay response curve. However, dielectric waveguide cables may have a non-flat group delay response, but the example embodiments provide an offsetting non-flat group delay response, so the combination of substrate 104 with such cables provides a flatter total system group delay, across the desired millimeter-wave bandwidth. Additional modifications are possible in the described embodiments, and other embodiments are possible, within the scope of the claims.

What is claimed is:

1. A wave communication system, comprising:
an integrated circuit; and
a multilayered substrate electrically coupled to the integrated circuit, the multilayered substrate including: an antenna structure configured to transmit a circularly polarized wave in response to signals from the integrated circuit; and a waveguide including first and second waveguide members spaced circumferentially around a region, in which the waveguide is configured to guide the wave away from the region.

2. The system of claim 1, wherein the first waveguide member includes first and second portions, the first portion being a first distance away from a center of the region, the second portion being a second distance away from the center of the region, the first portion being a third distance away from the surface of the multilayered substrate, the second portion being a fourth distance away from the surface of the multilayered substrate, the first distance being less than the second distance, and the fourth distance being less than the third distance.

3. The system of claim 1, wherein the first waveguide member includes a structure tapering away from a center of the region as the structure nears the surface of the multilayered substrate.

4. The system of claim 1, wherein:
the antenna structure includes first and second antennas; and
the first antenna is electrically coupled to: a feed portion that is a first distance away from a surface of the multilayer substrate; and a transmitting portion that is a second distance away from the surface of the multilayered substrate;
the feed portion is a third distance away from a center of the region, and the transmitting portion is a fourth distance away from the center of the region; and
the second distance is less than the first distance, and the third distance is less than the fourth distance.

5. The system of claim 1, wherein:
the antenna structure includes first and second antennas; and
the first antenna includes a member oriented 90 degrees apart from a member of the second antenna.

6. The system of claim 1, wherein:
the antenna structure includes first and second antennas; and
the multilayered substrate includes a signal block structure positioned between the first and second antennas.

7. The system of claim 1, wherein the multilayered substrate includes a coupling structure configured to provide the circularly polarized wave to the antenna structure.

8. The system of claim 7, wherein the coupling structure includes a first branchline coupler and a second branchline coupler.

9. The system of claim 8, wherein the first branchline coupler and the second branchline coupler include respective linear striplines.

10. The system of claim 8, wherein the first branchline coupler and the second branchline coupler include respective arcuate striplines.

11. The system of claim 8, wherein the signal from the integrated circuit includes a differential signal having a first signal on a first line and a second signal on a second line, the first line is coupled to the first branchline coupler, and the second line is coupled to the second branchline coupler.

12. The system of claim 1, wherein the multilayer substrate is adapted to be coupled to a cable assembly including a dielectric cable and a waveguide coupler.

13. The system of claim 1, wherein:
the antenna structure is configured to transmit the circularly polarized wave away from a first surface of the multilayer substrate; and
the integrated circuit is mounted physically to a second surface of the multilayer substrate, the second surface opposite the first surface.

14. A wave communication system, comprising:
an integrated circuit; and
a multilayered substrate electrically coupled to the integrated circuit and adapted to be coupled to a cable, the multilayered substrate configured to communicate a circularly polarized wave between the integrated circuit and the cable, the multilayer substrate including a waveguide having first and second waveguide members spaced circumferentially around a region, in which the waveguide is configured to guide the wave away from the region.

15. The system of claim 14, wherein the multilayered substrate includes a structure configured to communicate the circularly polarized wave, the structure including feed structures and antennas, and the antennas electrically coupled to respective ones of the feed structures.

16. The system of claim 14, wherein the waveguide is configured to communicate the circularly polarized wave through the substrate.

17. The system of claim 14, wherein the multilayered substrate includes a structure configured to communicate the circularly polarized wave, the structure including feed structures and antennas, and the antennas electrically coupled to respective ones of the feed structures.

18. The system of claim 17, wherein the feed structures have a tapering shape between a first surface of the substrate adjacent the integrated circuit and a second surface of the substrate away from the first surface.

19. A wave communication system, comprising:
an integrated circuit; and
a multilayered substrate including:
  antenna feed structures coupled to the integrated circuit;
  antennas coupled to respective ones of the antenna feed structures; and
  a waveguide having first and second waveguide members spaced circumferentially around a region, in which the waveguide is configured to guide the wave away from the region.

* * * * *